(12) United States Patent
Choi

(10) Patent No.: US 7,115,468 B2
(45) Date of Patent: Oct. 3, 2006

(54) SEMICONDUCTOR DEVICE AND METHOD FOR FABRICATING THE SAME

(75) Inventor: Hyung-Bok Choi, Kyoungki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/140,843

(22) Filed: May 31, 2005

(65) Prior Publication Data

US 2005/0233520 A1 Oct. 20, 2005

Related U.S. Application Data

(62) Division of application No. 10/054,528, filed on Jan. 22, 2002, now Pat. No. 6,917,114.

(30) Foreign Application Priority Data

Aug. 29, 2001 (KR) .............................. 2001-52387

(51) Int. Cl.
*H01L 21/8242* (2006.01)
(52) U.S. Cl. ...................... 438/253; 438/210; 438/396; 438/760; 438/761; 438/778
(58) Field of Classification Search ................ 438/210, 438/239, 250, 253, 393, 396, FOR. 220, 438/FOR. 430, 760, 761, 778
See application file for complete search history.

(56) References Cited

U.S. PATENT DOCUMENTS

| | | | | |
|---|---|---|---|---|
| 5,618,761 | A | * | 4/1997 | Eguchi et al. .............. 438/785 |
| 6,051,859 | A | * | 4/2000 | Hosotani et al. ............ 257/306 |
| 6,066,528 | A | * | 5/2000 | Fazan et al. ................ 438/253 |
| 6,297,122 | B1 | * | 10/2001 | Eguchi et al. .............. 438/396 |
| 6,500,750 | B1 | * | 12/2002 | Shroff et al. ............... 438/622 |
| 2002/0004293 | A1 | * | 1/2002 | Soininen et al. ............ 438/584 |
| 2004/0235255 | A1 | * | 11/2004 | Tanaka et al. .............. 438/302 |

* cited by examiner

*Primary Examiner*—George R. Fourson
*Assistant Examiner*—Joannie Adelle Garcia
(74) *Attorney, Agent, or Firm*—Marshall, Gerstein & Borun LLP

(57) ABSTRACT

A semiconductor device and a fabricating method for the same are disclosed, in which when forming a capacitor sacrificial film pattern, even if a misalignment occurs, the degradation of the dielectric property due to a direct contact between the contact plug and the dielectric medium can be prevented. The semiconductor device includes a connecting part connected through an insulating layer of a substrate to a conductive layer, a seed separating layer formed around the connecting part and the insulating layer to provide an open region exposing at least part of the connecting part, a seed layer filled into the open region of the seed separating layer and a capacitor. The capacitor includes of a lower electrode formed upon the seed layer, a dielectric medium formed upon the lower electrode, and an upper electrode formed upon the dielectric medium.

7 Claims, 5 Drawing Sheets

SEMICONDUCTOR DEVICE AND METHOD FOR FABRICATING THE SAME

CROSS-REFERENCE TO RELATED APPLICATION

This is a divisional of application Ser. No. 10/054,528 filed on Jan. 22, 2002, now U.S. Pat. No. 6,917,114, which is incorporated herein by reference.

BACKGROUND

1. Technical Field

A semiconductor device fabricating technique is disclosed. More Specifically, a semiconductor device with a capacitor, and a fabricating method for the same is disclosed.

2. Description of the Related Art

In a semiconductor device, the capacitance of a capacitor C is expressed by $$\frac{\varepsilon A}{d}$$

(where $\varepsilon$ is the dielectric constant, A is the surface area, and d is the thickness of the dielectric medium). That is, the capacitance is proportional to the surface area of the storage electrode and to the dielectric constant of the dielectric medium.

Accordingly, in semiconductor fabricating processes in which the semiconductor device is becoming smaller, in order to secure the required level of capacitance, the structure of the storage electrode is three-dimensional, thereby increasing the surface area of the storage electrode. In the alternative, a high dielectric constant material such as BST [$(Ba,Sr)TiO_3$] is used to secure the required capacitance. The three-dimensional structures require a complicated fabricating process, and therefore, this method brings a rise in manufacturing costs and a reduction in yield. Meanwhile, the use of the high dielectric constant material such as BST causes degradation of the current leakage characteristics, because it is difficult to maintain the oxygen stoichiometry.

In the capacitor using BST, highly oxidation-resistant noble metals such as Pt, Ru and the like have to be used, but these metals are too stable. Accordingly, not only is etching difficult, but also a dry etching such as sputtering has to be used, with the result that a vertical profile cannot be easily obtained.

In order to solve these problems, the following method has been studied. Specifically, a sacrificial film such as an oxide film is utilized to form a capacitor pattern. Then one of the noble metals is deposited by applying the electrochemical deposition method (hereinafter, referred to as 'ECD'), and an etch-back is carried out.

FIGS. 1A to 1C are sectional views of the conventional fabricating method for the semiconductor device. First, as shown in FIG. 1A, a transistor is formed on a substrate 11. That is, a word line (not illustrated) and a source/drain 12 are formed on the substrate 11, and then, an interlayer insulating film 13 is deposited on the substrate 11.

Then the interlayer insulating film 13 is selectively etched to form a contact hole so as to expose relevant parts of the source/drain 12. Then polysilicon is deposited on the entire surface including the contact hole, and then, an etch-back or a chemical mechanical polishing (to be called CMP below) is carried out to form a polysilicon plug 14 within the contact hole.

Then a platinum seed layer 15 is formed on the polysilicon plug 14, and then, a capacitor sacrificial film 16 is deposited on the platinum seed layer 15. Here, the platinum seed layer 15 is for forming a lower electrode by carrying out the electrochemical deposition method (ECD). A Physical Vapor Deposition method (to be called PVD below) is carried out to form the platinum seed layer 15.

Then a photoresist film is spread on the capacitor sacrificial film 16, and then the photoresist film is patterned by an exposure and a development to form a storage node mask 17. Then by using the mask 17, the capacitor sacrificial film 16 is dry-etched by using $CF_4$, $CHF_3$ or $C_2F_6$ to open a concave part 18 by which the platinum seed layer 15 is exposed.

Then as shown in FIG. 1B, a bias is supplied to the platinum seed layer 15, and a platinum lower electrode 19 is deposited on the exposed platinum seed layer 15 by applying the electrochemical deposition method. Then the capacitor oxide film 16 is etched to expose the portion of the platinum seed layer 15, on which the platinum lower electrode 19 has not been formed. Then the exposed platinum seed layer 15 is removed by an etch-back. Under this condition, the platinum seed layer 15 is divided, and therefore, the platinum lower electrode 19 is divided between the adjacent cells.

Then as shown in FIG. 1C, a BST film 20 is deposited on the entire surface including the platinum lower electrode 19 by applying the chemical vapor deposition (to be called CVD below) method. Then an upper electrode 21 is deposited on the BST film 20 by applying the CVD method. However, in the conventional technique as described above, when forming the open part by etching the capacitor sacrificial film, the mask pattern upon the sacrificial film may cause a misalignment. In this case, the upper face of the plug is exposed when carrying out an etching to remove the seed layer.

In FIG. 2, the elements same as those of FIGS. 1A to 1C are assigned with the same reference codes. As shown in the portion A of FIG. 2, the BST film and a barrier layer (for forming the plug 14) are directly contacted to each other, and therefore, the dielectric property of the BST film is degraded.

SUMMARY OF THE DISCLOSURE

A semiconductor device and a fabricating method for the same are disclosed, in which when forming a capacitor sacrificial film pattern, even if a misalignment occurs, the degradation of the dielectric property due to a direct contact between the contact plug and the dielectric medium can be prevented.

Such a semiconductor device comprises: a connecting part connected through an insulating layer of a substrate to a conductive layer; a seed separating layer formed around the connecting part and the insulating layer to open at least the connecting part; a seed layer filled into the open part of the seed separating layer; and a capacitor comprising a lower electrode formed upon the seed layer, a dielectric medium formed upon the lower electrode and an upper electrode formed upon the dielectric medium.

A method for fabricating a semiconductor device comprises: forming a connecting part connected through an insulating layer of a substrate to a conductive layer; forming a seed separating layer around the connecting part and the insulating layer to open at least the connecting part; forming a seed layer to fill the open part of the seed separating layer; forming a lower electrode of a capacitor upon the seed layer; forming a dielectric medium of the capacitor upon the lower electrode; and forming an upper electrode of the capacitor upon the dielectric medium.

In an embodiment, the seed layer fills the open part, and is disposed between the connecting part and the dielectric medium.

In an embodiment, the seed separating layer comprises a material having an etch selection ratio with the insulating layer.

In an embodiment, the seed separating layer can have a thickness ranging from about 50 Å to about 2000 Å.

BRIEF DESCRIPTION OF THE DRAWINGS

The disclosed devices and methods will now be described with reference to the attached drawings, wherein.

DETAILED DESCRIPTION OF THE PRESENTLY PREFERRED EMBODIMENT

FIGS. 3A to 3D are sectional views illustrating the disclosed fabricating method for the disclosed semiconductor device according to one embodiment.

Figure 1A:
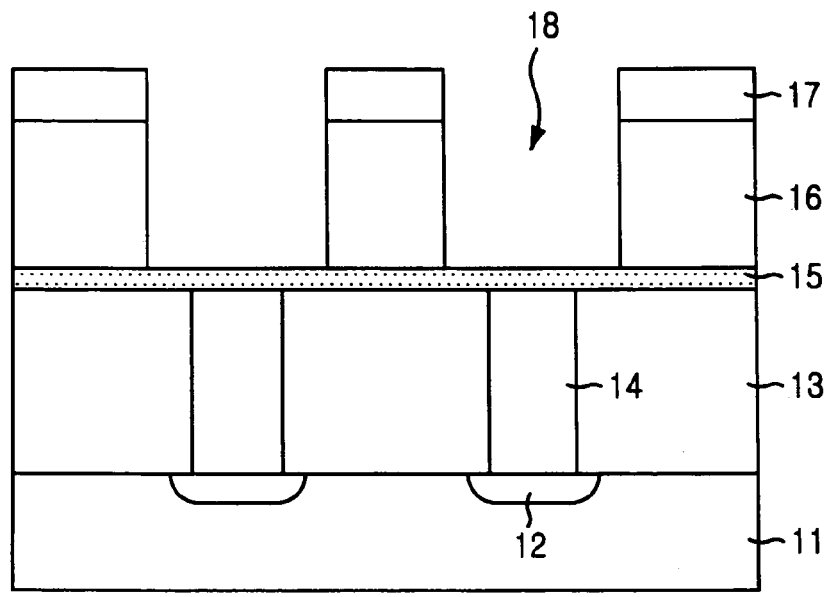
FIGS. 1A to 1C are sectional views illustrating the conventional fabricating method for the semiconductor device.
Figure 1B:
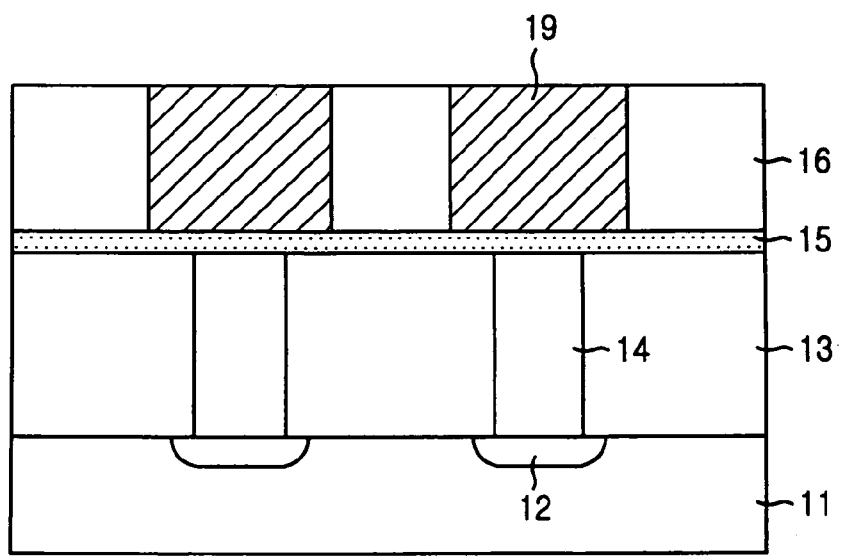
Figure 1C:
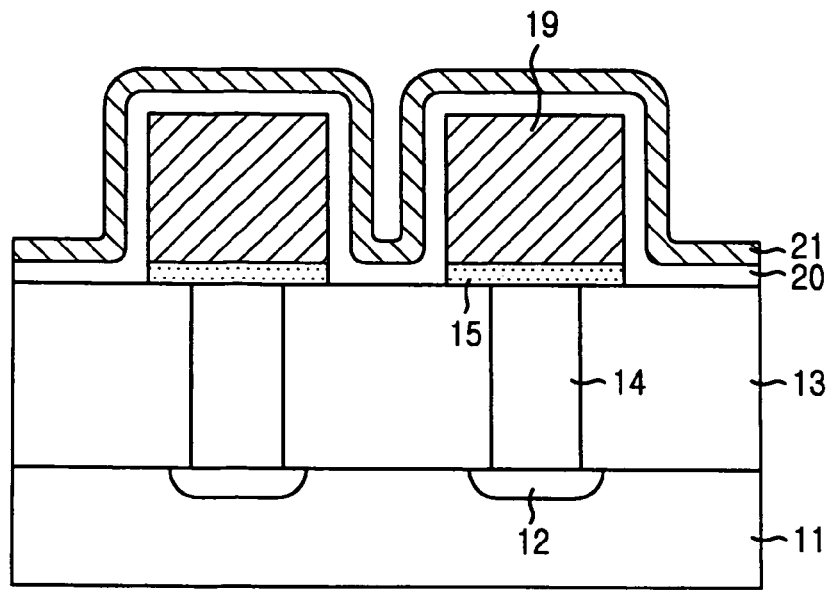
Figure 2:
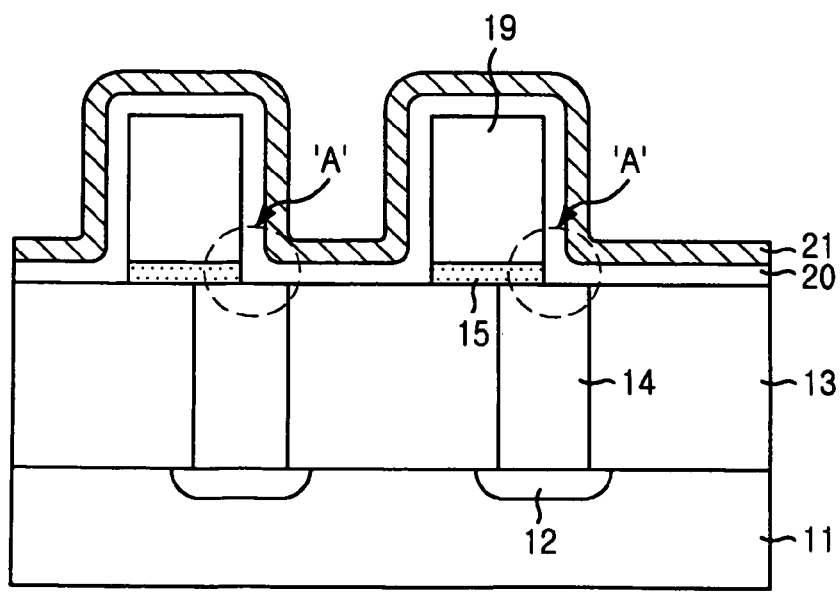
FIG. 2 is a sectional view illustrating the problems of the conventional semiconductor device.
Figure 3A:
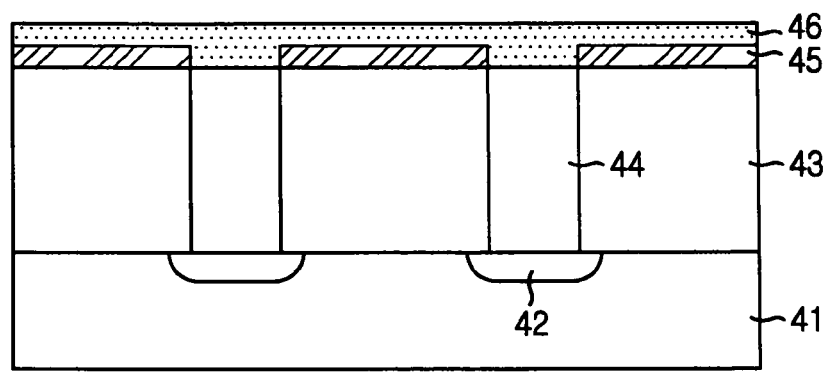
FIGS. 3A to 3D are sectional views illustrating a disclosed fabricating method for a semiconductor device.

First, as shown in FIG. 3A, a transistor is formed on a substrate 41. That is, a word line (not illustrated) and a conductive layer 42 such as a source/drain are formed on the substrate 41, and then, an insulating layer 43 is formed on the substrate 41.

Here, the insulating layer is formed by using one or more materials selected from the group consisting of: BSG (Boro Silicate Glass), BPSG (Boro Phospho Silicate Glass), HDP (High Density Plasma) oxide film, USG (Undoped Silicate Glass), TEOS (Tetra Ethyl Ortho Silicate), APL (advanced planarizarion layer) oxide film, SOG (Spin On Glass), and Flowfill.

Under this condition, by considering the etch selection ratio with the insulating layer 43, there may be additionally formed a material film (not illustrated) such as a silicon oxide-nitride film upon the insulating layer 43 to a thickness ranging from about 300 Å to about 1000 Å by carrying out a CVD method.

Then the insulating layer 43 is selectively etched to form a contact hole (not illustrated) so as to expose a part of the conductive layer 42. Then the interior of the contact hole is filled with a plug (not illustrated), a barrier layer (not illustrated) and the insulating layer 43. Then its top is flattened, and a connecting part 44 is formed.

Specifically, polysilicon is deposited upon the entire structure including the contact hole (not illustrated) so as to sufficiently fill the contact hole. Then a CMP or an etch-back is carried out to make the plug (not illustrated) be even with the insulating layer 43.

Under this condition, the polysilicon is that in which phosphorus (P) or arsenic (As) is doped. Further, the plug (not illustrated) is made of tungsten, W-silicide, TiN, TiAlN, TaSiN, TiSiN, TaN, TaAlN, TiSi or TaSi.

The plug material is deposited by carrying out a CVD, a PVD or an ALD.

Then a barrier layer (not illustrated) is formed. That is, titanium (Ti) is deposited on the entire surface, and then, an etching is carried out by using a mask to make the Ti film remain only upon the plug (not illustrated). Then a heat treatment is carried out so that the Si of the plug and the Ti can be reacted together, thereby forming a titanium silicide film (not illustrated) upon the plug.

Under this condition, the titanium silicide film forms an ohmic contact between the plug (not illustrated) and a lower electrode (which will be formed later).

Under this condition, the formation of the titanium silicide film may be omitted, and instead, a metal silicide film may be formed by using WSix, MoSix, CoSix, NoSix or TaSix.

Further, when filling the plug into the contact hole, a partial filling may be carried out to leave a recess. In this case, the depth of the recess should range from about 500 Å to about 1500 Å according to the thickness of the insulating layer 43.

Upon the plug and upon the titanium silicide film (not illustrated), there can be formed a barrier layer (not illustrated) which consists of a barrier metal layer and an oxide diffusion barrier layer.

The barrier metal layer (not illustrated) is formed by using at least one selected from the group consisting of: TiN, TiAlN, TaSiN, TiSiN, TaN, RuTiN and RuTiO. The oxide diffusion barrier layer (not illustrated) is formed by using at least one selected from the group consisting of: Ir, Ru, Pt, Re, Ni, Co and Mo.

Under this condition, the oxide diffusion barrier layer (not illustrated) is for preventing the downward oxygen diffusion when a heat treatment is carried out to crystallize the high dielectric constant material or the ferroelectric material. In order to improve the diffusion prevention, an $N_2$ or $O_2$ plasma treatment should be preferably carried out, or a heat treatment may be carried out in a parallel manner.

Then a seed separating layer 45 is formed around the connecting part 44 and the insulating layer 43 to open the connecting part 44. Then a seed layer 46 is formed to fill the open part.

Now the above process will be described in greater detail.

A nitride-based seed separating layer 45 is formed upon the connecting part 44 and the insulating layer 43 to a thickness ranging from about 50 Å to about 2000 Å. Then the connecting part 44 is opened through exposure and development and by using a mask, and a seed layer 46 is formed upon the entire structure including the open region. That is, the seed layer 46 is deposited to a thickness ranging from about 100 Å to about 10000 Å, so that the open region can be sufficiently filled.

Then the upper face of the seed layer 46 is flattened by carrying out a CMP or an etch-back. That is, the seed layer 46 is made higher than the seed separating layer 45 as shown in the drawing, or is planarized with the seed separating layer 45.

Under this condition, the seed layer 46 is formed with one selected from the group consisting of: Pt, Ru, Ir, Os, W, Mo, Co, Ni, Au and Ag.

Figure 3B:
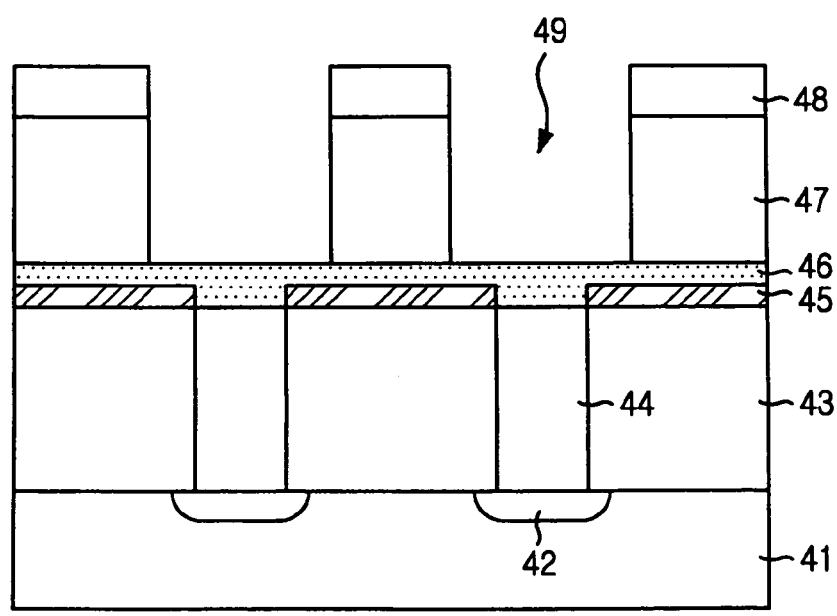

Then as shown in FIG. 3B, a capacitor sacrificial film 47 is deposited upon the seed layer 46 to a thickness ranging from about 5000 Å to about 10000 Å. Then a photoresist film is spread on the capacitor sacrificial film 47, and then, the photoresist film is patterned to form a storage node mask 48.

Then by using the mask 48, the capacitor sacrificial film 47 is dry-etched by using a gas such as $CF_4$, $CHF_3$ or $C_2F_6$ to open a concave part 49 by exposing a part of the seed layer 46. Then a pre-cleaning is carried out.

The capacitor sacrificial film 47 is formed with a non-conductive material such as an oxide or photoresist.

Figure 3C:
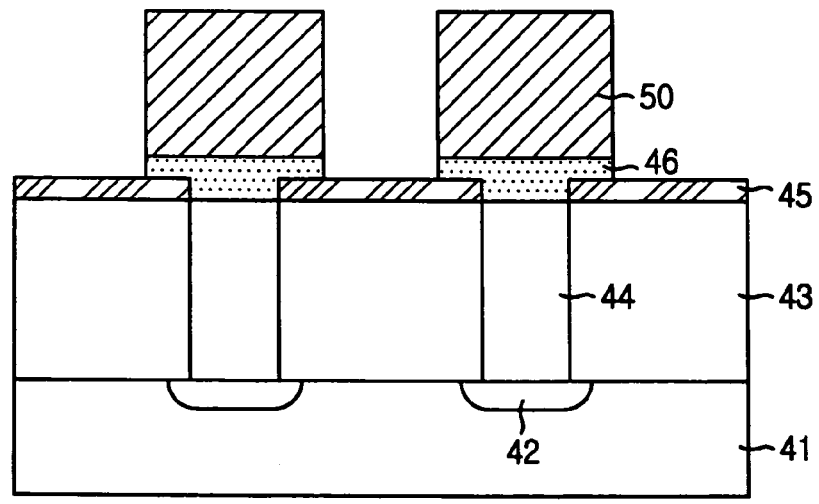

Then as shown in FIG. 3C, a bias is supplied to the seed layer 46 to deposit a lower electrode 50 upon the seed layer 46 by applying an electrochemical deposition method (ECD). Then a PR strip process is carried out to remove the mask 48.

Under this condition, in carrying out the ECD, the power is DC (direct current), pulses or reverse pulses. The current density is 0.1 mA/cm$^2$ to 10 mA/cm$^2$, thereby adjusting the vertical step difference with the capacitor sacrificial film 47.

Then the capacitor sacrificial film 47 is etched until the surface of the seed separating layer 45 is exposed. Thus, the portions of the seed layer 46 where the lower electrode 50 has not been deposited are exposed. Then the exposed portions of the seed layer 46 are removed by etching. Under this condition, the seed layer 46 is separated into a plurality of parts, and therefore, the lower electrode 50 is also separated into a plurality of parts between adjacent cells.

When the capacitor sacrificial film 47 is etched, a wet etching is employed by using a solution of HF or a mixture of HF and $NH_4F$.

When the dry etching is carried out, for example, Pt or the like is re-deposited on the sidewalls of the lower electrode 50 to form a residual material. This residual material is removed by carrying out a cleaning by using an SC-1 or SC solution.

Then upon the entire surface including the lower electrode 50, there are sequentially deposited a dielectric medium 51 and an upper electrode 52.

Specifically, the dielectric medium 51 is deposited to a thickness ranging from about 150 Å to about 500 Å by applying the CVD, ALD or PVD method and by using a ferroelectric material or a high dielectric constant material selected from the group consisting of: $TiO_2$, $HfO_2$, $Y_2O_3$, $Ta_2O_5$, STO ($SrTiO_3$), BST, PZT, PLZT ((Pb, La) (Zr, Ti)$O_3$), BTO ($BaTiO_3$), SBTN((Sr,Bi) (Ta, Nb)$_2O_9$), SBT ((Sr, Bi)$Ta_2O_9$), BLT((Bi, La)$Ti_3O_{12}$), BT($BaTiO_3$), ST($SrTiO_3$), and PT($PbTiO_3$).

In the case where the BST is deposited by applying the CVD, the deposition temperature preferably ranges from about 400° C. to about 600° C.

Then in order to improve the dielectric constant of the dielectric medium 51, there is carried out a crystallization heat treatment at a temperature ranging from about 400° C. to about 800° C. under an atmosphere of $O_2$, $N_2$, Ar, $O_3$, He, Ne or Kr.

Under this condition, as the heat treatment, a diffusion furnace heat treatment or a rapid thermal process (RTP) is adopted, and the heat-treating time should be preferably range from about 30 to about 180 seconds.

Then the upper electrode 52 is formed upon the dielectric medium 51, and then, a patterning and a metal wiring process are carried out, thereby completing the capacitor.

Figure 3D:
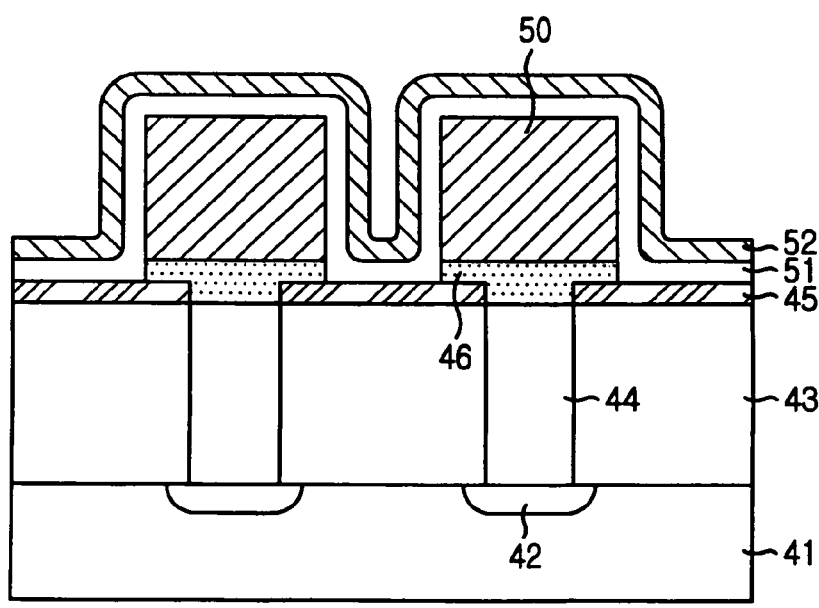

FIG. 3D is a sectional view of the completed semiconductor device according to the present invention.

As shown in the drawing, the completed semiconductor device includes: a connecting part 44 connected through an insulating layer 43 of a substrate 41 to a conductive layer 42; a seed separating layer 45 formed around the connecting part 44 and the insulating layer 43 to open at least the connecting part 44; a seed layer 46 filled into the open part of the seed separating layer 45; and a capacitor consisting of: a lower electrode 50 formed upon the seed layer 46, a dielectric medium 51 formed upon the lower electrode 50 and an upper electrode 52 formed upon the dielectric medium 51.

Figure 4:
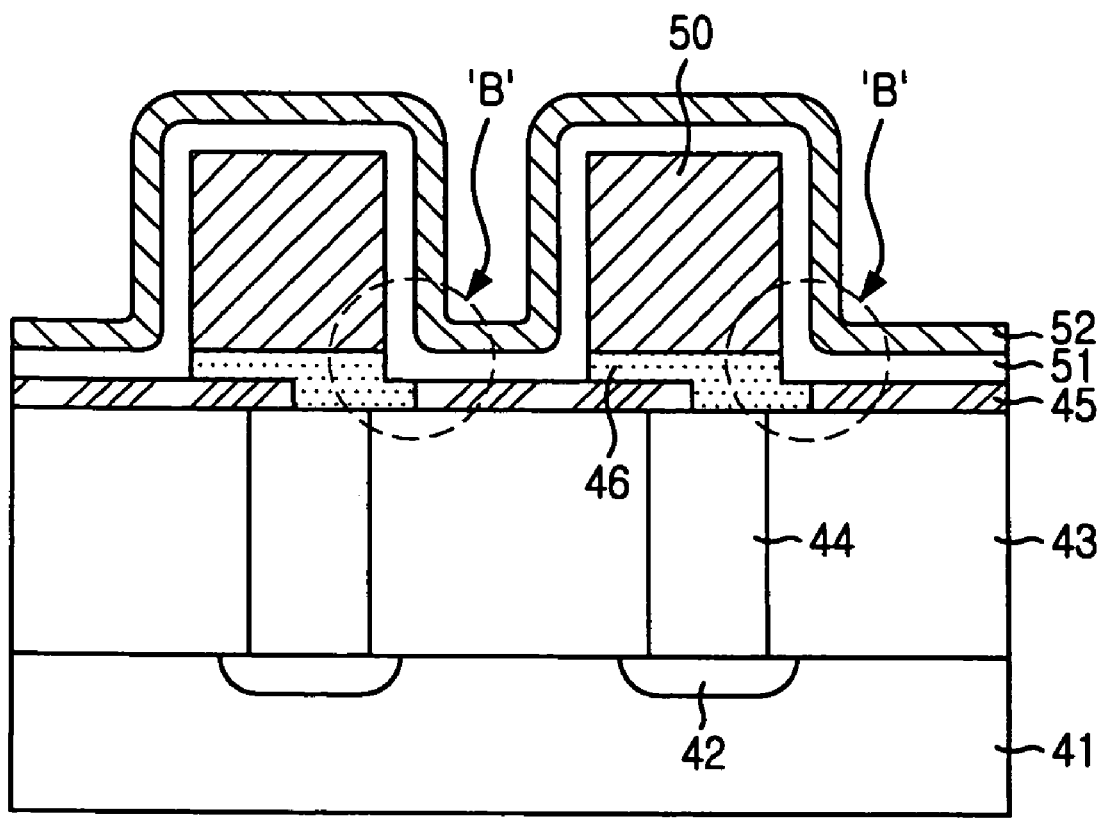
FIG. 4 is a sectional view illustrating that the problems of the conventional technique have been solved by the disclosed methods.

FIG. 4 is a sectional view of the semiconductor device of the present invention with the capacitor formed therein, in which a misalignment has occurred during the formation of the capacitor sacrificial film pattern.

Even if a misalignment has occurred, any direct contact between the dielectric medium 51 and the connecting part 44 can be avoided owing to the step difference which is formed by the seed separating layer 45. The elements of FIG. 4 same as those of FIGS. 3A to 3D are assigned with the same reference codes.

Alternatively, it may be possible to prevent the contact between the contact plug and the dielectric medium by thickly depositing the seed layer without forming the seed separating layer.

In this case, however, the separations between the adjacent seed layer parts are difficult. Further, the seed separating layer not only separates the adjacent seed layer parts, but also provides an etch selection ratio with the lower portion during the patterning of the capacitor sacrificial film so as to serve as an etch stop film. Further, the seed separating layer provides a step difference between the upper portion and the lower portion.

As described above, a seed separating layer is formed around the connecting part and the insulating film to open the connecting part. Accordingly, even if a misalignment occurs during the patterning of the capacitor sacrificial film, a direct contact between the dielectric medium and the connecting part can be prevented owing to the vertical step difference which is provided by the seed separating layer. As a result, the degradation of the dielectric property of the capacitor can be minimized.

Accordingly, a seed separating layer is formed around the connecting part and the insulating film to open the connecting part. Accordingly, even if a misalignment occurs during the patterning of the capacitor sacrificial film, a direct contact between the dielectric medium and the connecting part can be prevented owing to the vertical step difference which is provided by the seed separating layer. As a result, the yield can be improved.

In the above, the present invention was described based on specific preferred embodiments and the attached drawings, but it should be apparent to those ordinarily skilled in the art that various changes and modifications can be added without departing from the spirit and scope of the present invention, which will be defined in the appended claims. Further, various embodiments of the present invention will be possible.

What is claimed is:

1. A method for fabricating a semiconductor device, comprising:
    forming a connecting part connected through an insulating layer of a substrate;
    forming a seed separating layer over the connecting part and the insulating layer to provide at least an open region exposing the connecting part;
    forming a seed layer to fill the open region of the seed separating layer and cover the connecting part;
    forming a lower electrode of a capacitor only on a surface of the seed layer;
    forming a dielectric layer of the capacitor upon the lower electrode; and
    forming an upper electrode of the capacitor upon the dielectric layer.

2. The method as claimed in claim 1, wherein the open region of the seed separating layer is formed on part of the connecting part and on part of the insulating layer.

3. The method as claimed in claim 1, wherein the step of forming the seed layer in the open region comprises:
   depositing the seed layer on an entire surface of the seed separating layer and in the open region; and
   carrying out a planarization to remove portions of the seed layer remaining on the seed separating layer.

4. The method as claimed in claim 1, wherein the seed separating layer has an etch selection ratio with the insulating layer.

5. The method as claimed in claim 1, wherein the insulating layer has a thickness ranging from about 50 Å to about 2000Å.

6. The method as claimed in claim 1, wherein the step of forming the lower electrode comprises:
   forming a capacitor sacrificial film pattern and etching the capacitor sacrificial film pattern so as to expose the seed layer;
   forming the lower electrode on the exposed seed layer by carrying out an electrochemical deposition method;
   removing the capacitor sacrificial film; and
   removing the seed layer exposed by the lower electrode.

7. The method as claimed in claim 1, wherein the seed layer comprises a material selected from the group consisting of Pt, Ru, Ir, Os, W, Mo, Co, Ni, Au, and Ag.

* * * * *